(12) United States Patent
Mos et al.

(10) Patent No.: US 7,710,572 B2
(45) Date of Patent: May 4, 2010

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Everhardus Cornelis Mos, Best (NL); Arie Jeffrey Den Boef, Waalre (NL); Maurits Van Der Schaar, Eindhoven (NL); Thomas Leo Maria Hoogenboom, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 188 days.

(21) Appl. No.: 11/606,376

(22) Filed: Nov. 30, 2006

(65) Prior Publication Data

US 2008/0128644 A1    Jun. 5, 2008

(51) Int. Cl.
  *G01N 21/00* (2006.01)
  *G01N 21/25* (2006.01)
  *G01N 21/55* (2006.01)
(52) U.S. Cl. .................... 356/448; 356/341; 356/408; 356/433; 356/435
(58) Field of Classification Search ................ 250/559.04–559.08; 356/485
See application file for complete search history.

(56) References Cited

U.S. PATENT DOCUMENTS

| | | | | |
|---|---|---|---|---|
| 4,890,239 A | * | 12/1989 | Ausschnitt et al. | 430/30 |
| 4,962,318 A | * | 10/1990 | Nishi | 250/548 |
| 5,005,046 A | * | 4/1991 | Hashimoto | 355/77 |
| 5,576,829 A | * | 11/1996 | Shiraishi et al. | 356/521 |
| 5,703,692 A | | 12/1997 | McNeil et al. | 356/445 |
| 5,712,707 A | * | 1/1998 | Ausschnitt et al. | 356/401 |
| 5,731,877 A | * | 3/1998 | Ausschnitt | 356/620 |
| 5,880,838 A | | 3/1999 | Marx et al. | 356/351 |
| 5,963,329 A | | 10/1999 | Conrad et al. | 356/372 |
| 6,130,750 A | * | 10/2000 | Ausschnitt et al. | 356/401 |
| 6,136,662 A | | 10/2000 | Allman et al. | |
| 6,198,527 B1 | * | 3/2001 | Nishi | 355/53 |
| 6,215,896 B1 | * | 4/2001 | Greig et al. | 382/149 |
| 6,248,486 B1 | * | 6/2001 | Dirksen et al. | 430/30 |
| 6,288,454 B1 | * | 9/2001 | Allman et al. | 257/797 |
| 6,317,211 B1 | * | 11/2001 | Ausschnitt et al. | 356/401 |
| 6,541,287 B2 | * | 4/2003 | Ino et al. | 438/16 |
| 6,608,690 B2 | | 8/2003 | Niu et al. | 356/635 |
| 6,699,624 B2 | | 3/2004 | Niu et al. | 430/5 |
| 6,704,661 B1 | | 3/2004 | Opsal et al. | 702/27 |
| 6,721,691 B2 | | 4/2004 | Bao et al. | 702/189 |
| 6,738,138 B2 | | 5/2004 | Wei | 356/369 |

(Continued)

OTHER PUBLICATIONS

Search Report and Written Opinion for Singapore Application No. 200717103-6 mailed Dec. 19, 2008, 10 pgs.

*Primary Examiner*—Gregory J Toatley, Jr.
*Assistant Examiner*—Jarreas C. Underwood
(74) *Attorney, Agent, or Firm*—Sterne, Kessler, Goldstein & Fox P.L.L.C.

(57) ABSTRACT

A fault detection and classification method is disclosed that uses raw back-focal-plane image data of radiation from a substrate surface, detected by a scatterometer detector, to determine a variation in the raw data and correlate the variation in the raw data with a possible fault in a lithographic apparatus or a process that patterned the substrate surface. The correlation is carried out by comparing the variation in the raw data with known metrology data. Once a fault has been determined, a user may be notified of the fault.

32 Claims, 3 Drawing Sheets

U.S. PATENT DOCUMENTS

| | | | |
|---|---|---|---|
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 * | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 7,119,953 B2 * | 10/2006 | Yun et al. | 359/385 |
| 7,555,216 B2 * | 6/2009 | Yoshino et al. | 398/77 |
| 2001/0008273 A1 | 7/2001 | Groeneveld et al. | |
| 2002/0103607 A1 * | 8/2002 | Crell | 702/34 |
| 2002/0106848 A1 * | 8/2002 | Wack et al. | 438/200 |
| 2003/0081191 A1 * | 5/2003 | Nishi et al. | 355/69 |
| 2003/0091087 A1 * | 5/2003 | Ershov et al. | 372/55 |
| 2004/0119970 A1 | 6/2004 | Dusa et al. | 356/237.1 |
| 2005/0031975 A1 * | 2/2005 | Reuhman-Huisken et al. | 430/30 |
| 2005/0185174 A1 | 8/2005 | Laan et al. | 356/243.1 |
| 2006/0033921 A1 | 2/2006 | Den Boef et al. | 356/446 |
| 2006/0066855 A1 | 3/2006 | Boef et al. | 356/401 |
| 2006/0126074 A1 | 6/2006 | Van Der Werf et al. | 356/489 |
| 2006/0139592 A1 | 6/2006 | Den Boef et al. | 355/53 |
| 2006/0146304 A1 * | 7/2006 | Schwab et al. | 355/53 |

* cited by examiner

INSPECTION METHOD AND APPARATUS, LITHOGRAPHIC APPARATUS, LITHOGRAPHIC PROCESSING CELL AND DEVICE MANUFACTURING METHOD

FIELD

The present invention relates to a method of inspection usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, one or more parameters of the patterned substrate are typically measured, for example the overlay error between successive layers formed in or on the substrate. There are various techniques for making measurements of the microscopic structures formed in a lithographic process, including the use of a scanning electron microscope and various specialized tools. One form of specialized inspection tool is a scatterometer SM1 in which a beam of radiation is directed onto a target on the surface of the substrate and one or more properties of the scattered or reflected beam are measured. By comparing one or more properties of the beam before and after it has been reflected or scattered by the substrate, one or more properties of the substrate may be determined. This may be done, for example, by comparing the reflected beam with data stored in a library of known measurements associated with a known substrate property. Two main types of scatterometer SM1 are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity of the scattered radiation as a function of angle. An ellipsometer also measures polarization state.

A scatterometer is typically used to detect a fault in an exposed (i.e. patterned) layer on a substrate and thereby potentially one or more corresponding faults in the lithographic apparatus used to form the patterned layer on the substrate. This sort of fault detection and classification (FDC) is currently carried out using metrology performance metrics such as measuring the overlay of overlapping gratings in subsequent patterned layers, and critical dimension (CD) or sidewall angle of a structure formed on the substrate. FDC carried out in this way is discussed in SEMI standard E133-0705. However, using a scatterometer to determine the exact shape of a structure on a layer is typically time consuming and processing power intensive.

An alternative to metrology performance metrics is the use of process tool data. The way this is done is that sensor and/or actuator data of a process tool is monitored. This data (or variation in data from one run to the next) is used as an indicator for a possible fault in the respective process or in previous processes. In most known implementations of FDC on metrology metrics, the performance metric (for example the overlay) is measured on a few sites of a few substrates per "lot" of substrates on dedicated metrology targets such as overlay targets that are normally present in the scribe lane.

The following is a description of fault measuring known in the art. A scatterometer such as that described above can be used to measure the overlay—that is the position of an exposed target with respect to one or more previous targets on the same site of the substrate in a previous layer. A scatterometer is alternatively used to turn raw spectral data into grating profile parameters such as CD (i.e. width of generally bar-like structures) and sidewall angle.

However, a scatterometer such as discussed above is not very practical in trying simply to determine whether a system is running well, as scatterometry requires a lot of processing power in order to obtain precise measurements of exactly what is happening at the substrate surface level.

In order to reduce the computation time, a previous method has simply reduced the number of sites per substrate used in the calculations. A problem with using only a limited number of sites per lot of substrates is that only a limited number of data points are available for each FDC performance metric. As few data points are used as is still feasible to keep computation time to a minimum. In other words, it has been desirable to reduce the number of data points, potentially sacrificing accuracy, in order to reduce the computation time.

An alternative is the use of a scanning electron microscope (SEM) to measure the width, predominantly, of the structures of a printed image with great precision. However, this is also a time-consuming method of determining precise measurements of the substrate (or product layer) surface as the substrate containing the product layer, etc., has to be removed from a lithographic cell and placed in the SEM at each time when measurement is required. If the aim is to track changes that might be an error in an exposure system, using an SEM is a time-inefficient way to do this.

SUMMARY

In order to determine a fault within a lithographic system, it is not necessary to know exactly what the substrate or product layer looks like; only how it varies over time or from one system to another. In this way, a gradual change in a single system or in equalities in a range of systems may be monitored and acted upon before a large error is made.

It is desirable, for example, to provide a system of fault detection and classification using as large a number of data points as possible without increasing the complication of calculations and thereby increasing computation time, in turn reducing throughput of substrates in a lithographic apparatus.

According to an aspect of the invention, there is provided an inspection apparatus configured to measure a property of a substrate, comprising:

a detector configured to detect radiation, redirected from a structure on a substrate, at a back focal plane of the detector;

a control system configured to monitor a change in the redirected radiation and to correlate the change with a fault in the substrate; and a notification system configured to notify a user when a fault is determined.

According to a further aspect of the invention, there is provided a method of measuring a property of a substrate, comprising:

creating a structure on the substrate;

illuminating the structure on the substrate with a radiation beam;

detecting the radiation beam after it has been redirected from the structure, at the back focal plane of a detector;

repeating the creating, illuminating and detecting for (i) a plurality of dies on a substrate, or (ii) a plurality of substrates in a single lot, or (iii) a plurality of lots of a similar type of substrate, or (iv) any combination of (i)-(iii);

monitoring a change in the redirected radiation beam;

correlating the monitored change with a fault by comparing the change to existing metrology data; and generating a notification of the fault.

According to a further aspect of the invention, there is provided a lithographic apparatus configured to measure a property of a substrate, comprising:

a substrate table configured to hold a substrate;

a system configured to transfer a pattern to the substrate;

a detector configured to detect radiation, redirected from a structure on a substrate, at a back focal plane of the detector;

a control system configured to monitor a change in the redirected radiation and to correlate the change with a fault in the substrate; and a notification system configured to notify a user when a fault is determined.

According to a further aspect of the invention, there is provided a lithographic cell configured to measure a property of a substrate, comprising:

a lithographic apparatus;

a substrate processing device;

a detector configured to detect radiation, redirected from a structure on a substrate, at a back focal plane of the detector;

a control system configured to monitor a change in the redirected radiation and to correlate the change with a fault in the substrate; and a notification system configured to notify a user when a fault is determined.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
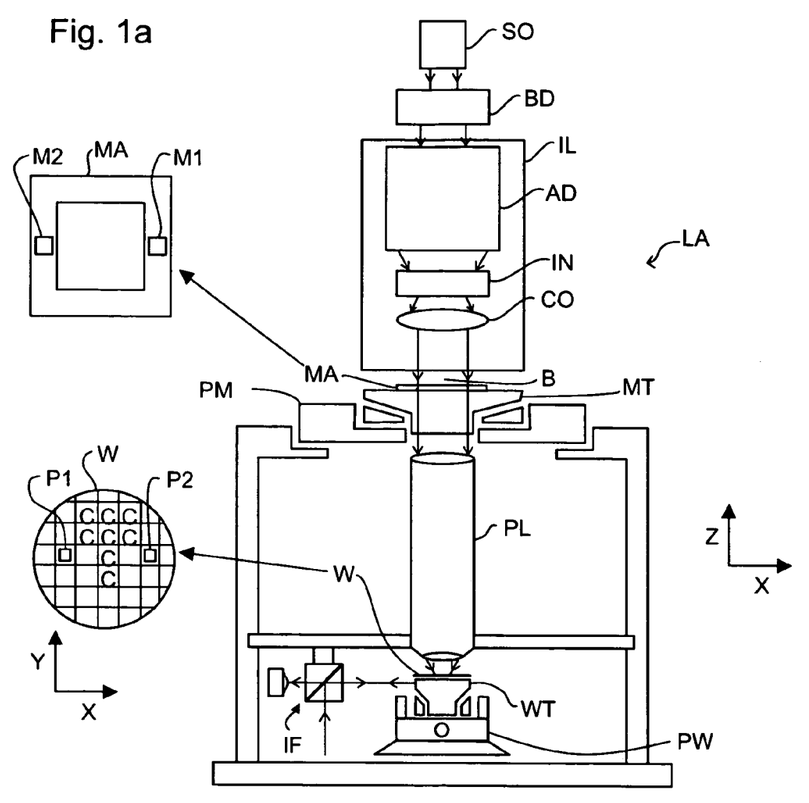
FIG. 1a depicts a lithographic apparatus.

FIG. 1a schematically depicts a lithographic apparatus. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
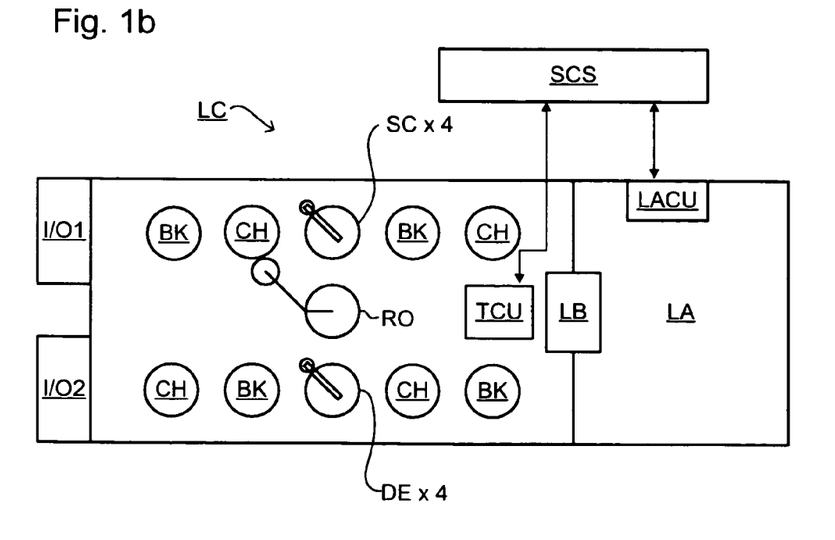
FIG. 1b depicts a lithographic cell or cluster.

As shown in FIG. 1b, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked—to improve yield—or discarded—thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

Figure 2:
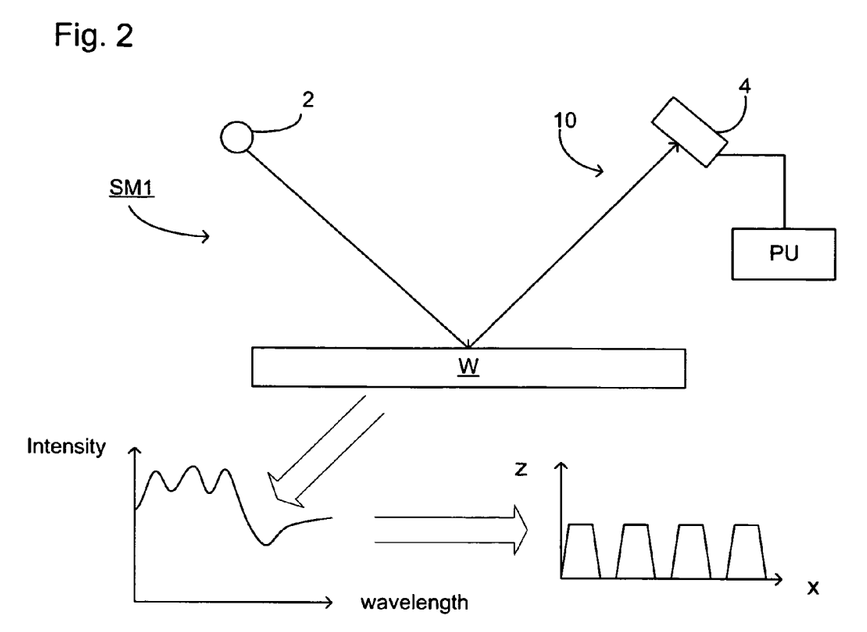
FIG. 2 depicts a first scatterometer.

FIG. 2 depicts a scatterometer SM1 which may be used in an embodiment of the invention. It comprises a broadband (white light) radiation projector 2 which projects radiation onto a substrate W. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer SM1 may be configured as a normal-incidence scatterometer or an oblique-incidence scatterometer.

Figure 3:
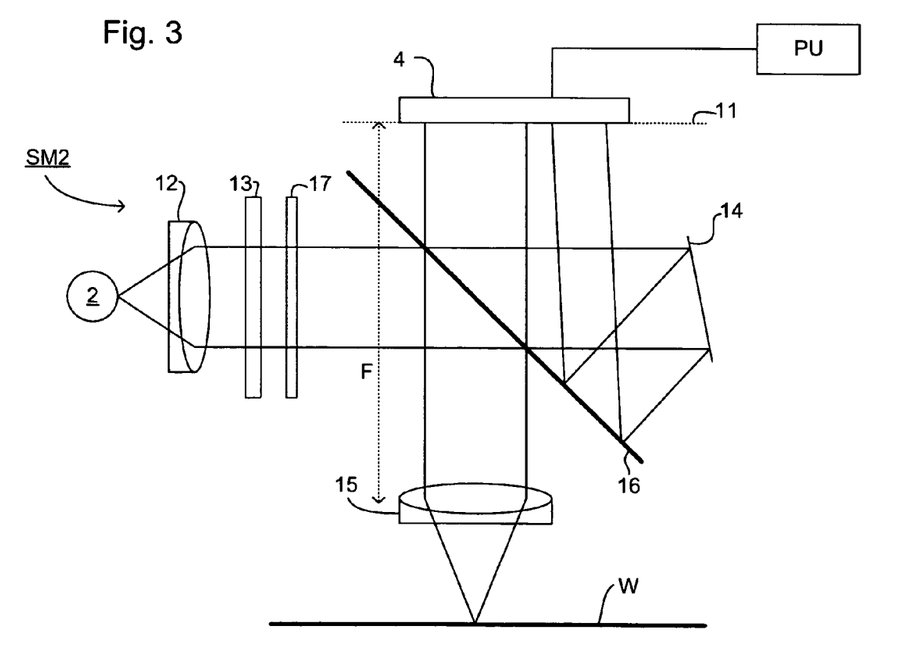
FIG. 3 depicts a second scatterometer.

Another scatterometer SM2 that may be used with an embodiment of the invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 4 in order to have the scatter spectrum detected. The detector may be located in the back-projected pupil plane 11, which is at the focal length of the lens 15, however the pupil plane may instead be re-imaged with auxiliary optics (not shown) onto the detector 4. The pupil plane is the plane in which the radial position of radiation defines the angle of incidence and the angular position defines the azimuth angle of the radiation. The detector is desirably a two-dimensional detector so that a two-dimensional angular scatter spectrum (i.e. a measurement of intensity as a function of angle of scatter) of the substrate target can be measured. The detector 4 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 4.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 4 may measure the intensity of scattered radiation at a single wavelength (or a narrow wavelength range), the intensity separately at multiple wavelengths or the intensity integrated over a wavelength range. Further, the detector may separately measure the intensity of transverse magnetic—(TM) and transverse electric—(TE) polarized radiation and/or the phase difference between the transverse magnetic- and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

The target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by processing unit PU, from knowledge of the printing step and/or other scatterometry processes.

When reconstructing a target pattern (e.g., a grating) accurately, it is desirable to determine where a fault in the manufacture of the target pattern may occur. A fault that occurs in the target pattern is likely also to occur in one or more other structures on the substrate and the target pattern is therefore a useful way of determining and classifying a fault in a lithographic system. A fault occurring anywhere in a lithocell or in any process that the substrate undergoes may contribute to an error in the printed structures on the substrate surface. The process that may produce a fault include: developing, etching, polishing and deposition. Alternatively or additionally, the fault may occur during the alignment of the substrate or even in an illumination system, such as in a patterning device.

As discussed above, the larger the number of data points that can be detected on the target pattern, the better detection of a potential fault. However, increasing the number of data points also typically increases the computation needed because each data point would require separate detection, correlation with known data and comparison with previous data points in the same position.

Most current metrology FDC applications require one or more dedicated targets (such as one or more overlay targets) because only then is it possible to obtain "direct" performance metrics such as overlay and CD/sidewall-angle absolute measurements. An embodiment of the present invention does not aim at direct performance measurements and may therefore also be used for in-die measurements. By "direct performance measurements", it is understood that the measurement is carried out on a dedicated test structure, such as a diffraction grating. On the other hand, "in-die" measurements can be carried out on a product layer of the substrate as an intermediate or final product. In-die measurements save time and substrate surface space over direct performance measurements by not requiring one or more special test structures to be formed and being able to be carried out effectively "on the fly".

Of course, as an alternative to using an existing printed product pattern, the structure or pattern that is measured may be a dedicated target such as a diffraction grating, e.g. with a specific period and phase. If a dedicated target is used, it is easier to meet the criterion of having a repeating structure, which makes it much easier to notice a variation in, for example, the phase of the repeating structure that could indicate a fault. The positional invariance of the back focal plane that is useful to an embodiment of the present invention also relies to some extent on having a repeating structure.

In an embodiment of the invention, raw data that is collected in the back focal plane (also known as the back-projected pupil plane or the Fourier plane) of a scatterometry-based sensor is used. This is simply the intensity image of, for example, a CCD sensor 4. The monitoring for a fault can be done by monitoring a change of this image acquired with a structure pattern that is expected not to vary. The raw data that is collected is simply an intensity image of the diffracted radiation, without further manipulation that takes unnecessary time as discussed above. The intensity image is compared with existing data in order to determine what differences there are in the intensity image with respect to the expected intensity image. A difference between the images indicates a processing error (such as an overlay error or an imaging error).

Because this intensity image can also be used to calculate measurements such as critical dimension, side-wall angle and so on, data showing the variation of one or more of these metrics is also present in the CCD image of the sensor 4. It is with the variation in one or more of these measurements that an embodiment of the invention is able to determine a process excursion or fault. Specifically, a library or database of the raw data for one or more known target shapes and errors in the shapes is created and added to as various exposure tests are carried out. The raw image data can therefore be directly compared with known data and the fault giving rise to the variation in the raw image data determined. In summary, the intensity distribution of the back focal plane image is a function of one or more performance measures. As such, a variation in the intensity distribution of the back focal plane image is an indication of a change in that performance measure(s).

Once a change has been detected and correlated with a type of fault, the system can raise an alarm to indicate that a fault has been detected. The system can also classify the fault into a classification based on where in the apparatus or process the fault occurs and what needs to be done to correct it.

Figure 4:
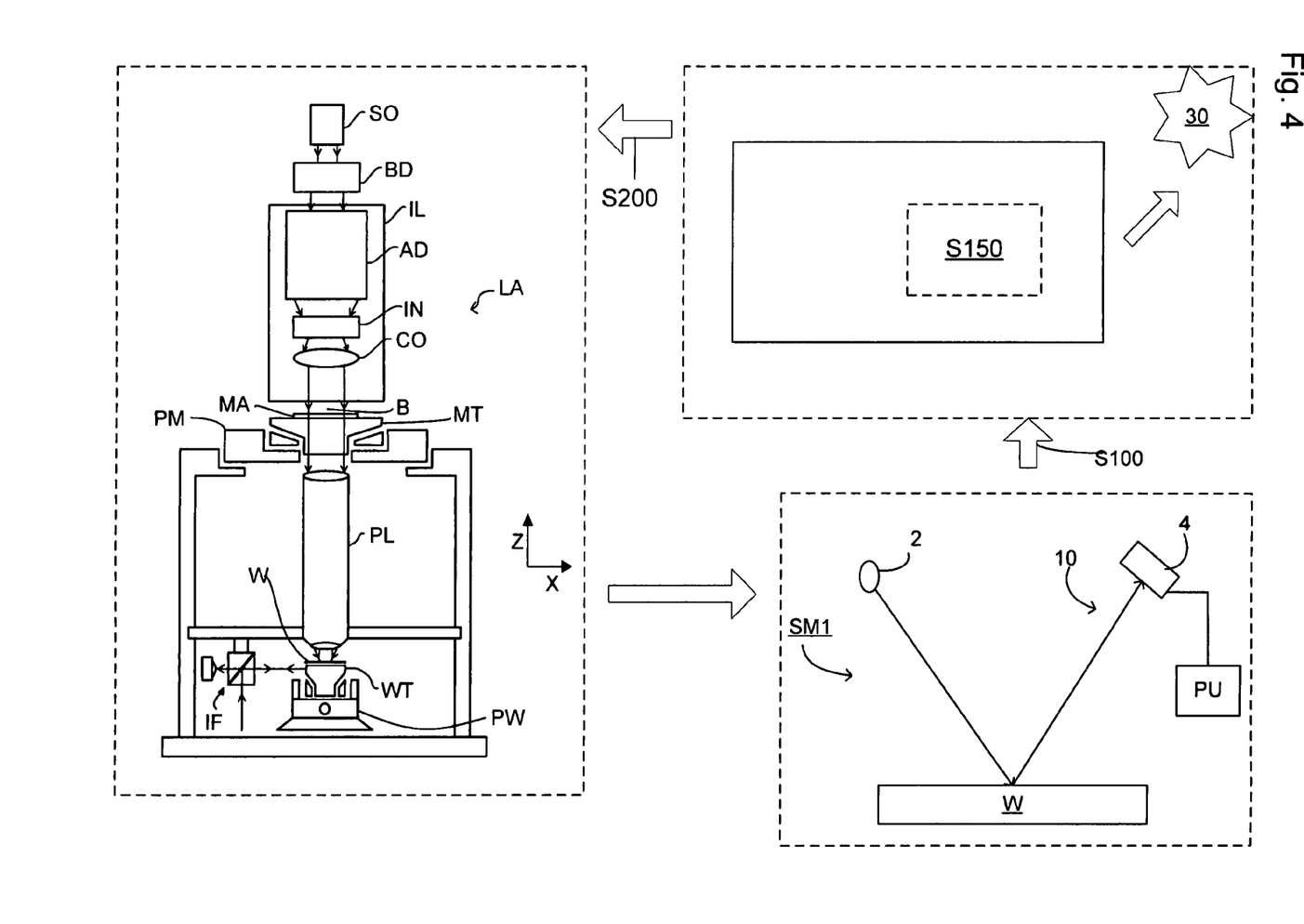
FIG. 4 depicts a relationship between a scatterometer and a lithographic apparatus according to an embodiment of the present invention.

The method of detecting a fault according to an embodiment of the present invention comprises the following steps as shown in FIG. 4:

1. obtaining 10 a raw back-focal-plane image of a scatterometer SM1 sensor on a product die or dedicated structure (i.e. metrology target) on as many dies or substrates W (with similar or desirably identical patterns) as possible;
2. generating S100 a measure for the change or variation of the back-focal-plane raw image data over:
   a) dies of a substrate W,
   b) substrates W in a lot,
   c) substrate lots of a similar product (based on whatever process information that is available; e.g. the identification information of a process tool or the settings "recipe" of the tool), or
   d) any combination of a, b and c;
3. correlating S150 the measure of a change or variation to a known fault (i.e. determine a metric for fault chance) by comparing the variation to existing raw image data, e.g.:
   a) by comparing to metrology data on one or more performance measures (such as overlay, CD, sidewall angle, etc.),
   b) by comparing to a known process fault, or
   c) by correlating to process tool data (e.g. sensor data of a process tool such as an alignment wafer quality (WQ, where WQ is a measure of the strength of a signal from an alignment mark)); and
4. generating S200 a notification by:
   a) notifying a user using an alarm 30,
   b) alerting a FAB (fabrication) automation to carry out more in-depth measurement of a suspected die/substrate/lot,
   c) preventing further processing (e.g. exposure) of a substrate W or lot with a suspect die, and/or
   d) if the problem has occurred before, also providing a classification of the fault.

The existing metrology data may include one or more known process faults such as dose error, focus error, overlay error and layer uniformity error; or include process tool data, which is sensor data of a process tool. Alternatively or additionally, the existing metrology data may include sensor data, alignment data, leveling data of the substrate, applied exposure dose, or applied radio frequency power.

The fault indicator can be used in any of a number of ways:

A) To determine if a process is running on target and a substrate can pass through to the next processing step, e.g., determine if an overlay value is close to zero and CD is close to a target value.

B) To determine if a metrology measurement is needed to determine the exact process offset. In this way, an unnecessary metrology measurement can be avoided, resulting in a shorter cycle (or throughput per substrate) time.

C) To monitor process offset on a structure for which known metrology measurement is difficult because of the computational complexity of the structure, e.g., a product structure with many degrees of freedom. Furthermore, a process offset can be linked with another, more precise metrology measurement to determine by what this offset is likely to have been caused for future comparison.

An advantage of this fault detection and classification system over a classical metrology method is that it provides an additional fault detection mechanism. Additionally or alternatively, more sites or dies on the substrate W can be measured because time-consuming reconstruction of a target parameter is not required and so each measurement takes less time.

A scatterometer SM1 sensor can measure as many as fifty sites per substrate W for all substrates at 150 substrates per hour throughput. Because more sites can be measured, the fault selection probability will increase. An advantage of using the back focal plane of the scatterometer SM1 sensor is that it is position-invariant for repeating structures. This means that the reproducibility of the measure of change or variation in a CCD image does not depend on the position accuracy of the scatterometer SM1. The mechanism can also be used in an exposure system to prevent exposure of a faulty substrate, thus increasing the efficiency of a system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of measuring a property, comprising:
reflecting a beam from first and second structures;
detecting the reflected radiation beam;
determining a first difference as a difference between first and second intensity values corresponding to intensity of light reflected respectively from the first and second structures; and
determining presence of a fault by comparing the first difference to existing metrology data comprising a second difference, the second difference being a difference between third and fourth intensity values corresponding to intensities of light previously reflected from respective third and fourth structures.

2. The method of claim 1, wherein at least one of the first and second structures is a product structure.

3. The method of claim 1, wherein at least one of the first and second structures is a specialized measurement target structure.

4. The method of claim 1, wherein the third structure is formed in a first layer on a substrate superimposed on the fourth structure formed in a second layer on the substrate, wherein the second difference corresponds to an overlay error.

5. The method of claim 1, wherein the third structure is formed on the substrate and the fourth structure is formed external to the substrate, wherein the second difference corresponds to an alignment error.

6. The method of claim 1, wherein the second difference corresponds to at least one of a critical dimension and a sidewall angle measurement.

7. The method of claim 1, wherein the existing metrology data further comprises a known process fault.

8. The method of claim 7, wherein a known process fault is one or more selected from the group comprising: dose error, focus error, overlay error and layer uniformity error.

9. The method of claim 1, wherein the existing metrology data further comprises process tool data.

10. The method of claim 9, wherein the process tool data is sensor data of a process tool.

11. The method of claim 1, wherein the existing metrology data further comprises sensor data.

12. The method of claim 1, wherein the existing metrology data further comprises alignment data.

13. The method of claim 1, wherein the existing metrology data further comprises leveling data of the substrate.

14. The method of claim 1, wherein the existing metrology data further comprises applied exposure dose.

15. The method of claim 1, wherein the existing metrology data further comprises applied radio frequency power.

16. The method of claim 1, further comprising preventing further processing of a substrate that contains a die with a detected fault.

17. The method of claim 1, further comprising providing a classification for a die, substrate or lot where the fault has occurred previously.

18. The method of claim 1, wherein at least one of the first and second structures is a diffraction grating.

19. The method of claim 1, wherein the fault is in a process step in the processing of a substrate.

20. The method of claim 19, wherein the process step is one or more selected from the group comprising: developing, etching, polishing and deposition.

21. The method of claim 1, wherein the fault is in alignment of a substrate.

22. The method of claim 1, wherein the fault is in an illumination system.

23. An inspection apparatus configured to measure a property, comprising:
   a detector configured to detect radiation reflected from first and second structures, at a back focal plane of the detector, wherein the detector is further configured to output intensity data corresponding to the detected radiation;
   a control system configured to determine a presence of a fault by,
      determining a first difference as a difference between first and second intensity values corresponding to intensity of light reflected respectively from the first and second structures, and
      comparing the first difference to a second difference, the second difference being a difference between third and fourth intensity values corresponding to intensities of light previously reflected from respective third and fourth structures; and
   a notification system configured to notify a user when the fault is determined.

24. A lithographic apparatus configured to measure a property of a substrate, comprising:
   a substrate table configured to hold a substrate;
   a system configured to transfer a pattern to the substrate;
   a detector configured to detect radiation reflected from first and second structures, wherein the detector is further configured to output intensity data corresponding to the detected radiation;
   a control system configured to determine a presence of a fault by,
      determining a first difference as a difference between first and second intensity values corresponding to intensity of light reflected respectively from the first and second structures, and
      comparing the first difference to a second difference, the second difference being a difference between third and fourth intensity values corresponding to intensities of light previously reflected from respective third and fourth structures; and
   a notification system configured to notify a user when the fault is determined.

25. A lithographic cell configured to measure a property of a substrate, comprising:
   a lithographic apparatus;
   a substrate processing device;
   a detector configured to detect radiation reflected from first and second structures, wherein the detector is further configured to output intensity data corresponding to the detected radiation;
   a control system configured to determine a presence of a fault by,
      determining a first difference as a difference between first and second intensity values corresponding to intensity of light reflected respectively from the first and second structures, and
      comparing the first difference to a second difference, the second difference being a difference between third and fourth intensity values corresponding to intensities of light previously reflected from respective third and fourth structures; and
   a notification system configured to notify a user when the fault is determined.

26. The method of claim 1, wherein the third and fourth intensity data is stored after the previous reflection.

27. The method of claim 1, wherein the first and second structures are formed on a substrate.

28. The method of claim 1, wherein the first and second structures are formed on a respective substrate in a lot of substrates.

29. The method of claim 1, wherein the first and second structures are formed on first and second substrates, respectively, the first and second substrates being of different lots.

30. The method of claim 1, further comprising:
   generating a notification of the fault.

31. The method of claim 30, wherein the notification of the fault is in the form of an alarm.

32. The method of claim 30, wherein the notification of the fault is in the form of an alert to a detection system to carry out a larger number of in-depth measurements of a suspected die on a substrate.

* * * * *